(12) United States Patent
Freeman

(10) Patent No.: US 8,835,757 B2
(45) Date of Patent: Sep. 16, 2014

(54) LOCKING SUBGRADE VAULT

(75) Inventor: Eric Freeman, Lodi, CA (US)

(73) Assignee: Oldcastle Precast, Inc., Auburn, WA (US)

(*) Notice: Subject to any disclaimer, the term of this patent is extended or adjusted under 35 U.S.C. 154(b) by 391 days.

(21) Appl. No.: 13/294,054

(22) Filed: Nov. 10, 2011

(65) Prior Publication Data

US 2012/0111866 A1 May 10, 2012

Related U.S. Application Data

(60) Provisional application No. 61/412,252, filed on Nov. 10, 2010.

(51) Int. Cl.
*H02G 3/08* (2006.01)
*H02G 9/10* (2006.01)
*H01F 27/02* (2006.01)

(52) U.S. Cl.
CPC . *H02G 9/10* (2013.01); *H01F 27/02* (2013.01)
USPC .......................................................... 174/37

(58) Field of Classification Search
CPC ........... H02G 9/10; H02G 3/185; E03B 7/095
USPC .................... 220/484; 174/37, 60, 545, 562
See application file for complete search history.

(56) References Cited

U.S. PATENT DOCUMENTS

| 244,173 A | 7/1881 | Bell et al. |
|---|---|---|
| 279,952 A | 6/1883 | Kaufmann |
| 355,118 A | 12/1886 | Bancroft |
| 357,161 A | 2/1887 | Turner |
| 361,511 A | 4/1887 | Harford |
| 367,211 A | 7/1887 | Kimball |
| 373,953 A | 11/1887 | Tingley et al. |
| 376,693 A | 1/1888 | Warren |
| 379,138 A | 3/1888 | Stuart |
| 469,607 A | 2/1892 | Stevenson |
| 547,175 A | 10/1895 | Michelin |
| 3,039,666 A | 6/1962 | Carpenter, Sr. |
| 3,385,012 A | 5/1968 | Lovegreen |
| 3,530,696 A | 9/1970 | Dunmire |
| 3,858,614 A * | 1/1975 | Moore et al. ................... 138/105 |
| 3,974,599 A | 8/1976 | Grosh |
| D244,173 S | 5/1977 | Thurman |
| 4,163,503 A * | 8/1979 | McKinnon .................... 220/484 |
| 4,266,380 A | 5/1981 | Samolis |

(Continued)

FOREIGN PATENT DOCUMENTS

EP 0529178 3/1993

OTHER PUBLICATIONS

Notice of Allowance for Design U.S. Appl. No. 29/424,306, mailed Jan. 7, 2013, 5 pages.
U.S. Appl. No. 29/424,306, Jurich.

(Continued)

*Primary Examiner* — Anthony Stashick
*Assistant Examiner* — King M Chu
(74) *Attorney, Agent, or Firm* — Sheridan Ross P.C.

(57) ABSTRACT

A subgrade vault system and method of forming the same is provided. Specifically, a subgrade vault suitable for housing utility and similar equipment is provided, the vault comprising a main body portion, a cap, and a lid that may be selectively secured to prevent or deter unauthorized access to vault contents.

18 Claims, 13 Drawing Sheets

(56) References Cited

U.S. PATENT DOCUMENTS

| | | | |
|---|---|---|---|
| D279,952 S | 8/1985 | Daenen et al. | |
| 4,567,697 A | 2/1986 | Hahne | |
| 4,863,059 A | 9/1989 | Christensen | |
| 4,973,191 A | 11/1990 | Dannhauser | |
| 5,123,776 A | 6/1992 | Lang et al. | |
| 5,134,758 A | 8/1992 | Christensen | |
| 5,152,651 A | 10/1992 | Artéon | |
| 5,197,307 A * | 3/1993 | Abbott, Jr. | 70/164 |
| D355,118 S | 2/1995 | Dickinson et al. | |
| D357,161 S | 4/1995 | Booten | |
| D361,511 S | 8/1995 | Dickinson et al. | |
| 5,462,383 A * | 10/1995 | Van 'T Veer | 404/4 |
| D367,211 S | 2/1996 | Cautereels | |
| D373,953 S | 9/1996 | Gale | |
| D376,693 S | 12/1996 | Wolff | |
| D379,138 S | 5/1997 | Carlson | |
| D382,112 S | 8/1997 | Egan | |
| 5,697,729 A * | 12/1997 | Bowman | 404/25 |
| D394,550 S | 5/1998 | Tanji | |
| 5,782,584 A * | 7/1998 | Arthur | 405/303 |
| 5,829,215 A | 11/1998 | Billing | |
| D417,361 S | 12/1999 | Mittmann et al. | |
| 6,000,576 A | 12/1999 | Liu | |
| D426,064 S | 6/2000 | Douglas et al. | |
| 6,087,582 A * | 7/2000 | Arthur | 174/37 |
| D469,607 S | 2/2003 | Wolff | |
| 6,772,566 B1 * | 8/2004 | Machledt et al. | 52/169.6 |
| 6,899,240 B2 * | 5/2005 | Dang et al. | 220/3.8 |
| 6,932,099 B2 * | 8/2005 | Mahaney | 137/15.08 |
| D510,802 S | 10/2005 | Sagol | |
| 7,009,513 B2 | 3/2006 | Dang | |
| 7,030,315 B1 * | 4/2006 | Dunn et al. | 174/37 |
| D531,802 S | 11/2006 | Zimmerman | |
| 7,163,352 B2 | 1/2007 | Jurich et al. | |
| D547,175 S | 7/2007 | Berg | |
| 7,385,137 B2 * | 6/2008 | Burke et al. | 174/50 |
| 7,467,910 B2 | 12/2008 | Lecuyer et al. | |
| 7,500,412 B1 | 3/2009 | Maciejewski | |
| 7,501,573 B2 | 3/2009 | Balfour, Jr. | |
| D590,709 S | 4/2009 | Fitzsimmons | |
| D598,197 S | 8/2009 | Ahlstrom | |
| D606,306 S | 12/2009 | Monte | |
| 7,748,926 B2 | 7/2010 | Jurich et al. | |
| D622,061 S | 8/2010 | Higginson | |
| 7,807,923 B2 * | 10/2010 | Moran | 174/50 |
| D639,065 S | 6/2011 | Duvigneau | |
| D640,138 S | 6/2011 | Lee | |
| D648,538 S | 11/2011 | Reinhart et al. | |
| D654,693 S | 2/2012 | Freeman | |
| D662,323 S | 6/2012 | Freeman | |
| 8,302,796 B1 * | 11/2012 | Johnson | 220/3.9 |
| D696,526 S | 12/2013 | Christensen | |
| 2007/0194493 A1 | 8/2007 | Jurich et al. | |
| 2008/0169392 A1 * | 7/2008 | McClure et al. | 248/226.11 |
| 2010/0040433 A1 | 2/2010 | Poppe et al. | |
| 2010/0296865 A1 | 11/2010 | Jurich et al. | |
| 2010/0310338 A1 | 12/2010 | Diez Herrera | |
| 2010/0329782 A1 | 12/2010 | Miller et al. | |
| 2012/0228302 A1 * | 9/2012 | Byrns | 220/484 |
| 2014/0138387 A1 | 5/2014 | Dang | |

OTHER PUBLICATIONS

Brooks Products Meter Boxes and Pull Boxes, drawing revision date Dec. 6, 2000, 17 pages.
Brooks Products Meter Boxes and Pull Boxes, drawing revision date Jan. 9, 2001, 4 pages.
Applicant's Admitted Prior Art: Eisel Enterprises Inc. Precast Concrete Products, date unknown, 21 pages.
Applicant's Admitted Prior Art: US Concrete Precast Group Products, date unknown, 9 pages.
Notice of Allowance for Design U.S. Appl. No. 29/378,870, mailed Nov. 4, 2011, 9 pages.
Notice of Allowance for Design U.S. Appl. No. 29/386,380, mailed Feb. 29, 2012, 9 pages.
Official Action for Design U.S. Appl. No. 29/424,306, mailed Sep. 13, 2012, 7 pages.
U.S. Appl. No. 13/851,809, filed Mar. 27, 2013, Dang.

\* cited by examiner

LOCKING SUBGRADE VAULT

The present application claims the benefit of priority of U.S. Provisional Patent Application 61/412,252, filed Nov. 10, 2010, the entire disclosure of which is hereby incorporated by reference in its entirety.

FIELD OF THE INVENTION

The present disclosure relates generally to vaults for providing an enclosed region beneath a ground surface. More specifically, vaults are provided comprising a locking lid with a cap assembly for securing various electrical, water, communications and other components and systems below grade of ground level.

BACKGROUND OF THE INVENTION

Subgrade vaults are widely used to provide internal enclosed regions where connections can be made and housed. Classic examples of such connections are the joinder of electrical cables used in street lighting, in telephone and communication systems, and water valves for residential communities and golf courses. Such vaults are generally placed below grade of ground level with their upper surfaces at grade where loads from pedestrians and vehicles, as well as environmental factors such as the presence of precipitation and animals are anticipated. Generally they will be used by and allow access to municipalities, utilities, and other installations where longevity of the vaults, and affordability are important. Although subgrade vaults are typically comprised of precast or poured-in-place concrete, alternative materials such as fiberglass, plastic, and other materials may be used and the present invention is not limited to any given material.

Vault systems and devices are intended for access and interaction with trained professionals who, for example, need to service complex, dangerous, and/or valuable subgrade systems to maintain vital infrastructure. Accordingly, in addition for these devices and systems to withstand various forces and abuse due to environmental conditions, it is desirable to provide systems that allow for general ease of access to the appropriate individuals, while simultaneously preventing unauthorized access. A lid for providing access to an enclosed subgrade region must not only be structurally sound, but must be simple to remove and replace, while reliably holding the lid onto the body when access is not needed.

Subgrade storage systems generally contain and/or provide access to valuable components necessary in performing critical functions and/or with respect to monetary value. In part due to the high commodity prices of metals and other internal components, theft is an increasing problem which is not only expensive but extremely disruptive when communication, electrical or water service is discontinued. Furthermore, improperly secured or physically damaged subgrade systems may present hazardous conditions to passer-bys and professionals alike. Currently known systems fail to provide adequate safety and security measures for preventing and/or deterring unauthorized access to subgrade storage areas.

SUMMARY OF THE INVENTION

There has thus been a long-felt but unmet need to provide a subgrade vault system having features adapted for securing at least a lid portion to additional system components, such as a vault cap. The following references relate to the field of subgrade storage vaults and facilities and are hereby incorporated by reference in their entireties: U.S. Pat. No. 4,567,697 to Hahne, U.S. Pat. No. 6,772,566 to Machledt et al., U.S. Pat. No. 6,899,240 to Dang et al., U.S. Pat. No. 7,163,352 to Jurich et al., U.S. Pat. No. 7,385,137 to Burke et al., U.S. Pat. No. 7,467,910 to Lecuyer et al., and U.S. Pat. No. 7,748,926 to Jurich et al.

It is one object of the present invention to provide for an improved subgrade or above grade vault system having locking or selectively securing features to prevent unwanted access to an enclosed region. It is another object of the present invention to provide a concrete enclosure adapted for containing subgrade systems wherein the concrete enclosure comprises a lid which can be secured when the lid is generally in a closed or sealed position, thus preventing unwanted or unauthorized access to contents of the enclosure.

It is another object of the present invention to provide a multiple component system for securing subgrade systems and devices, the system comprising a cap assembly at least partially cast in a material including, but not limited to plastic or concrete, and a substantially rigid locking member secured to a portion of the cap, and a lid adapted for selective securing to the cap.

It is another object of this invention to provide an improved subgrade vault, with cost effective manufactured components to selectively secure an enclosure. In one embodiment components are comprised of a plastic product and/or concrete structure formed to a cap, one or more locking members or clips to join with a bolt or other hardware, to selectively secure a lid to the cap.

In various embodiments, the present invention comprises a cap adapted to be connected or secured to a concrete box or structure for containing, enclosing, and/or securing subgrade utility components. In one embodiment, the present invention comprises a plastic cap formed to or connected with a quantity of concrete, the concrete having a height extending downwardly from the plastic cap, a generally polygonal or rectangular shape, and a predetermined thickness. In one embodiment, the quantity of concrete comprises a top portion to which a cap is formed or attached and a bottom portion that is generally open. In an alternative embodiment, the present invention comprises a quantity of concrete comprising four side walls and a bottom portion, such that the device comprises a fully contained enclosure when a lid, as will be described in further detail, is placed on or connected to a top portion.

In various embodiments, precast concrete is used to form portions of a subgrade storage vault, as precast concrete is generally known to provide a substance that is simultaneously rigid and strong enough to accommodate various compressive and shear loading that a subgrade vault is likely to experience. However, it is to be expressly understood that the present invention is not limited to embodiments comprising precast concrete. Indeed, any rigid material determined to be economically feasible for use in subgrade storage vaults may be used to form the body and/or peripheral walls of a lockable subgrade storage vault in accordance with the present invention. For example, in various embodiments, a lockable subgrade vault structure is provided wherein various components comprise cellular concrete, polyethylene, polypropylene, polyvinyl chloride, nylon, polycarbonate, aluminum, acrylonitrile butadiene styrene, acetal, acrylic, epoxy, fluorocarbons, Ionomer, polybutylene, polyester, polystyrene, silicone, various combinations thereof and various similar materials thereto.

In various embodiments, the present invention comprises a subgrade storage facility wherein a molded plastic cap is first formed and a main body comprising four walls is formed or extruded therefrom. In a particular embodiment, the present invention comprises an injection molded, rotomolded or blow-molded plastic cap and a main body portion comprises precast concrete and a method of making the same. In one embodiment, the present invention comprises an injection molded cap adapted for receiving a locking device, wherein at least a portion of the locking device is secured to the cap and/or body upon extrusion or creation of the body portion from the cap. For example, a cap may be provided comprising four sides, each of said four sides having a width approximately corresponding to a width of a sidewall of a main body portion to be extruded or extended therefrom. Prior to extrusion of a sidewall, a locking bracket or element may be positioned on a cap such that a portion of the locking element is positioned within an area defined by the width(s) of the cap and at least a portion of the locking element disposed within an area corresponding to the open vault portion of the device. Thus, in at least one embodiment, a locking element is secured to a cap and/or main body portion through the creation or extrusion of the main body portion with at least a portion of the locking element remaining accessible for user interaction (e.g. securing and locking activities) through an open top and/or bottom portion of the device.

In various embodiments, a locking member comprises one or more apertures for receiving and securely attaching the locking member to additional components. For example, in one embodiment, a locking member comprises at least one aperture which receives a quantity of concrete and allows concrete to harden or cure in, around, and/or through the locking member. Thus, in various embodiments, a rigid connection between a quantity of concrete and a locking member is obtained, the connection generally being stronger than simply layering or sandwiching a locking member between two regions of concrete. Similarly, apertures may be provided on a locking member for receiving one or more portions of a cap member. For example, a cap member may be provided with pre-formed spikes or extensions which may be placed through portions of a locking member, thus preventing various movements of the locking member with respect to the cap and enhancing the connection between components.

In various embodiments, a locking element of the present invention comprises a rigid member, such as a metallic bar or wedge shaped feature. In one embodiment, the locking element comprises a rigid member adapted for being placed in and secured to one or more corners of a subgrade enclosure. For example, a rigid locking member may be disposed in and secured to a corner of a bottom portion of a plastic cap, such that at least a portion of the locking member overlaps or resides upon a portion of the cap and at least a portion of the locking member spans an open center portion of the cap. Thus, in one embodiment, the present invention comprises a locking member that spans a distance between generally perpendicular sides of a cap.

In one embodiment, a locking member of the present invention comprises a threaded through-hole for receiving a fastener. Obviously, locking features such as threaded through-holes should preferably be disposed in a portion of the locking member that is to be positioned within an open center (i.e. user accessible) portion of the vault. In an alternative embodiment, the present invention comprises a rigid member having a through-hole, the rigid member adapted for receiving a clip or additional component having one or more threaded through-holes. Accordingly, in one embodiment, a locking member is constructed of a minimal amount of material wherein an additional threaded component is adapted to be placed on the locking member, the threaded component comprising the appropriate thickness for a female threaded portion and thereby reducing the need for raw materials and associated cost of the device. In various embodiments, a threaded female portion is adjustable along a length of the locking member. For example, in one embodiment, a plurality of apertures are provided along a length of a locking member, each of the apertures capable of receiving a clip nut, or similar device for receiving a fastener.

It is to be expressly understood that various locking members may achieve objects of the present invention and, as such, the present invention contemplates numerous variations of the locking members as shown and described herein. These variations, as will be recognized by one of ordinary skill in the art include, but are not limited to variations within size, shape, orientation, material, and quantity of locking members that are provided. For example, although various figures included herewith depict a locking member having a first end and a second end disposed within a volume of concrete, it is contemplated that a locking member alternatively comprises a cantilever type mechanism secured to a main body portion and/or cap by only one end of the mechanism. Similarly, the present invention is not confined to vaults having locking members disposed proximal to a corner of a cap. Rather, a locking member may be disposed and extend inwardly from any number of points along an interior of a cap. It will also be expressly understood that various embodiments of locking members as described herein may be provided either in isolation or in combination with various other contemplated locking members or features.

In various embodiments, the present invention comprises one or more locking members comprising various different polygonal or round shapes. Thus, it is to be recognized that locking members of the present invention for use in subgrade vaults are not necessarily comprised of rectangular or evenly regularly shaped objects. Indeed, flanges or protrusions disposed along a shoulder of a cap may comprise a variety of different shapes, as may locking members such as bars secured to a cap and/or main body portion of the vault.

Locking members of the present invention may be comprised of any material known to provide sufficient strength properties and combinations thereof. Accordingly, although a preferred embodiment contemplates a metal locking mechanism disposed within a concrete main body portion and a plastic cap, the present invention is not limited to any such embodiment.

In various embodiments, the present invention comprises a lid adapted to be secured to a cap. In one embodiment, a lid of the present invention comprises a combination of plastic and a concrete material, wherein an outer portion of the lid is generally comprised of plastic to accommodate stress concentrations at specific locations and generally prevent or reduce the risk of chipping and cracking at corner and perimeter regions of the lid. An inner or central portion is generally comprised of a concrete material, such as Portland cement or precast concrete adapted for accommodating anticipated static and dynamic loading known to be experienced by a subgrade vault with a lid.

In one embodiment, a lid of the present invention comprises at least one aperture or through-hole and an optional cap, lid, or cover, for selectively sealing the same. The aperture or through-hole is formed such that a locking member is accessible by a fastening member, for example, through the aperture at least when the lid is placed on the cap in a closed position. Accordingly, when a lid is placed on or within a cap of the present invention, an enclosed vault region is established, with access to a locking member(s) provided through an aperture formed in the lid. Thus, when a lid is placed upon a subgrade vault, the lid may be further secured and/or locked to additional components via one or more fasteners. For example, in one embodiment, once a lid is placed upon a cap, one or more apertures formed in the cap provide above-grade access for a threaded fastener such as a bolt to be secured to a female threaded portion secured to a cap/main body portion as previously described. In various embodiments, cap or cover features are provided to cover or conceal apertures and locking hardware formed in a lid, thus providing a generally flush lid surface for improving aesthetic and safety characteristics of the lid.

In various embodiments, unauthorized access to an internal volume of a subgrade vault is prevented or at least minimized through the use of tamper-proof fasteners. For example, lids of the present invention may be secured to caps, vaults, and/or additional components through the use of one or more tamper-proof fasteners. One of skill in the art will recognize that a wide variety of known or custom-made tamper-proof fasteners may be employed in embodiments of the present invention, such that an ordinary passerby or potential pillager is unlikely to possess the requisite tool for removing/loosening the fastener. By way of example only, tamper-proof fasteners suitable for use in the present invention include, but are not limited to those available through Tamperproof Screw Company, Inc.

In one embodiment, the present invention comprises a subgrade vault having a lid with a single aperture formed in a corner of the lid and corresponding to a locking member formed in a cap/vault portion for securing the lid to the vault. In an alternative embodiment, the present invention comprises a lid having a plurality of apertures in a plurality of corners of the lid, each of the apertures corresponding to a subgrade locking mechanism for securing the lid to the cap/vault.

In various embodiments, the present invention comprises a lid with one or more apertures and corresponding subgrade locking mechanism(s) disposed in a central region of the lid and vault opening. For example, in a particular embodiment, the present invention comprises a lid with an aperture disposed in a central region of the lid and a locking mechanism spanning across a dimension of the cap and providing a point of attachment for the lid within a central region of the lid, or alternatively on one or more edges of the cap.

In various embodiments, the present invention comprises one or more apertures having removable features for selectively viewing or accessing a subgrade feature, such as a meter. For example, in one embodiment, a lid is provided having a removable feature adapted for being selectively removed from a remainder of the lid such that subgrade features, such as a water meter, may be read without the need for complete removal of the lid. In various embodiments, the removable feature or features comprise pry-off lids or caps adapted to be removed and applied with relative ease to observe or read one or more subgrade features. In alternative embodiments, caps or lids for observing subgrade features comprise securing features, such as tamper-proof fasteners as previously described.

In various embodiments, subgrade vault lids are provided having one more plates or portions adapted to display information. For example, in one embodiment, a composite plastic and concrete cover is provided having a plastic name plate for displaying general information related to the contents of the vault (e.g. "ELECTRICAL," "WATER," "GAS," etc.)

In one embodiment, a method of forming a subgrade concrete vault is provided comprising: (1) placing a locking member on the underside of a pre-formed plastic cap by aligning pre-formed plastic pins of said plastic cap through the corresponding holes provided in the locking element and applying a force to the locking element; (2) placing the plastic cap and locking member into a precast mold or on a vibrating table with a jig to align the cap with mold; (3) optionally inserting a sizing ring into the plastic cap; (4) pouring a concrete into a mold, wherein at least one boundary of the mold is defined by the cap; (5) verifying that the plastic cap and locking element have not been damaged; (6) placing the product into a kiln and curing the product; (7) removing the product from the kiln and verifying that it is ready to be shipped and/or sold. After forming, a concrete vault is provided with an integral plastic cap which includes a bracket embedded in the concrete vault and which is adapted to receive hardware such as a bolt which secures the lid to the cap and requires a special tool.

In one embodiment, a method of securing a lid to a subgrade concrete vault structure is provided, the method comprising: (1) placing a lid on a cap portion of a subgrade vault; (2) verifying that an aperture of the lid is generally aligned with a threaded aperture of a locking mechanism attached to a the subgrade vault; (3) where an aperture of the lid is not generally aligned with a threaded aperture of a locking mechanism, removing the lid, adjusting the location of the threaded aperture of the locking mechanism, and replacing the lid; (4) inserting and applying torque to a tamper-proof fastener until the fastener secures the lid to the vault via contact between a portion of the fastener with a portion of the lid and threaded attachment to the threaded aperture in the locking mechanism.

In various embodiments, a fastener connects a lid of the present invention to additional components (e.g. caps) based on contact between a head of the fastener and a portion of the lid. In an alternative embodiment, a lid aperture comprises a threaded through-hole through which a fastener is threadably secured.

In various embodiments, a lid of the present invention may be secured directly to a cap portion, such as a shoulder of the cap. For example, in one embodiment, a threaded fastener may be provided through an aperture in the lid and secured or threaded through a shoulder portion of the cap. Preferably, the shoulder portion of the cap to which the fastener and/or lid is secured comprises one or more reinforcing features as shown and described herein. In one embodiment, the shoulder portion of the cap comprises a rigid securing member to provide structure for the shoulder and, in at least one embodiment, female threads for receiving the fastener.

The Summary of the Invention is neither intended nor should it be construed as being representative of the full extent and scope of the present disclosure. The present disclosure is set forth in various levels of detail in the Summary of the Invention as well as in the attached drawings and the Detailed Description of the Invention and no limitation as to the scope of the present disclosure is intended by either the inclusion or non-inclusion of elements, components, etc. in this Summary of the Invention. Additional aspects of the present disclosure will become more readily apparent from the Detailed Description, particularly when taken together with the drawings.

The above-described benefits, embodiments, and/or characterizations are not necessarily complete or exhaustive, and in particular, as to the patentable subject matter disclosed herein. Other benefits, embodiments, and/or characterizations of the present disclosure are possible utilizing, alone or in combination, as set forth above and/or described in the accompanying figures and/or in the description herein below. Further details and other features will become apparent after review of the following Detailed Description and accompanying drawing figures.

BRIEF DESCRIPTION OF THE DRAWINGS

Those of skill in the art will recognize that the following description is merely illustrative of the principles of the disclosure, which may be applied in various ways to provide many different alternative embodiments. This description is made for illustrating the general principles of the teachings of this disclosure invention and is not meant to limit the inventive concepts disclosed herein.

The accompanying drawings, which are incorporated in and constitute a part of the specification, illustrate embodiments of the disclosure and together with the general description of the disclosure given above and the detailed description of the drawings given below, serve to explain the principles of the disclosures.

It should be understood that the drawings are not necessarily to scale. In certain instances, details that are not necessary for an understanding of the disclosure or that render other details difficult to perceive may have been omitted. It should be understood, of course, that the disclosure is not necessarily limited to the particular embodiments illustrated herein.

Figure 1A:
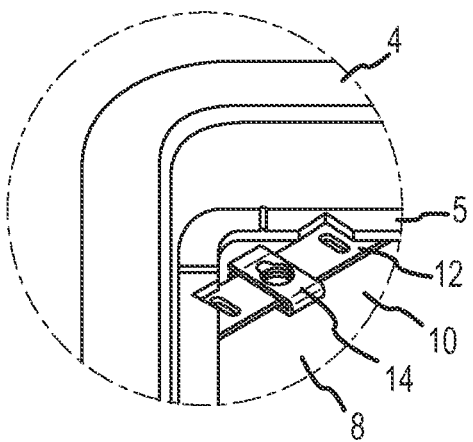
Figure 1:
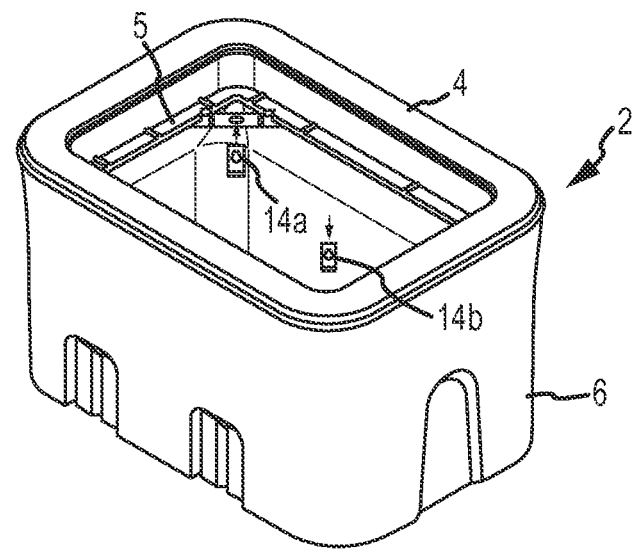
Figure 2:
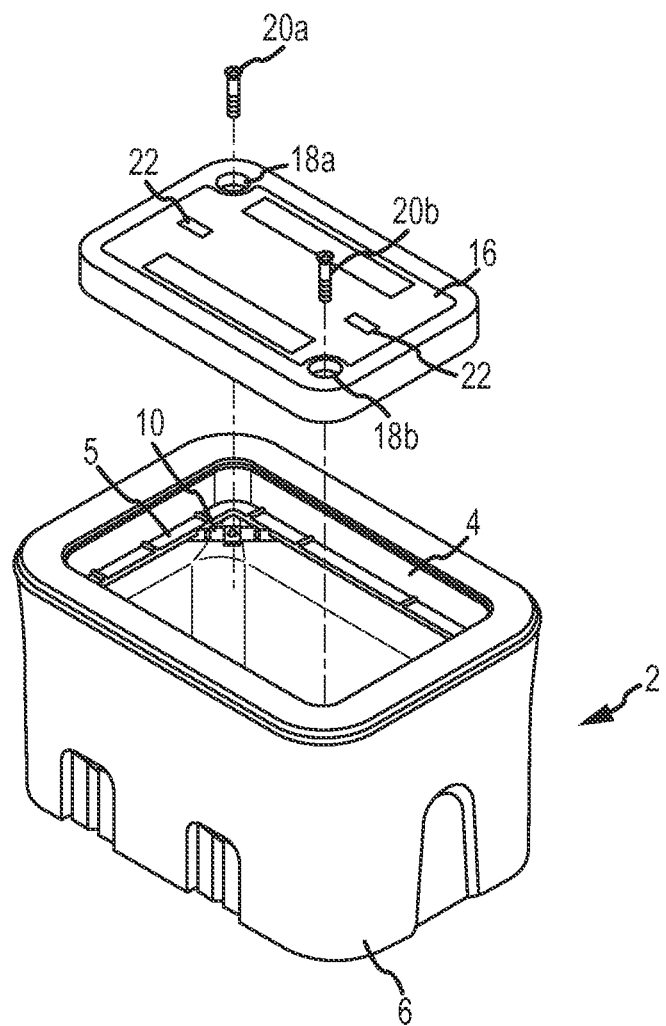
Figure 3:
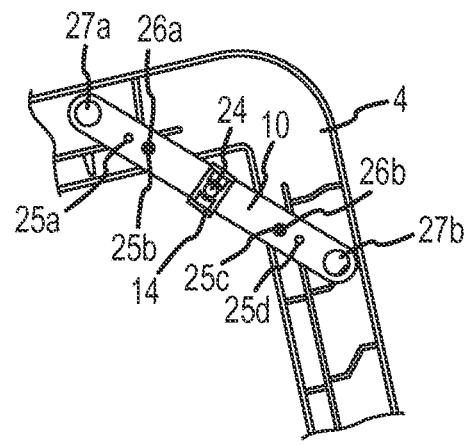
Figure 4:
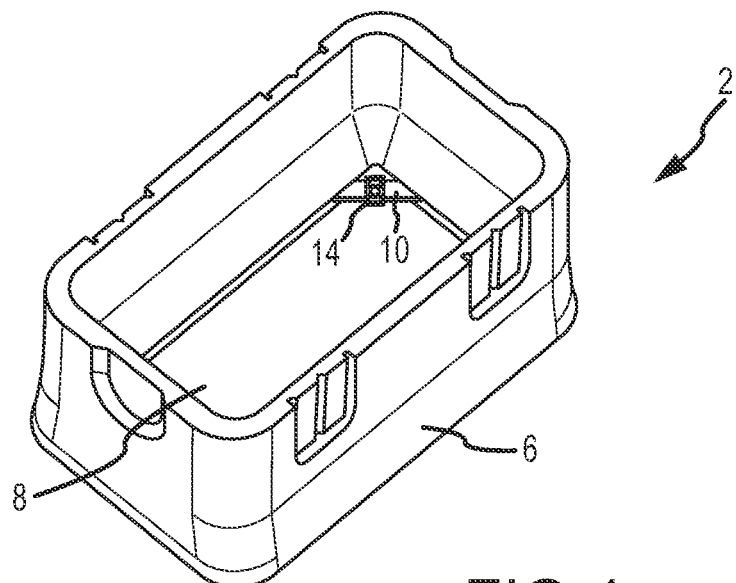
Figure 5:
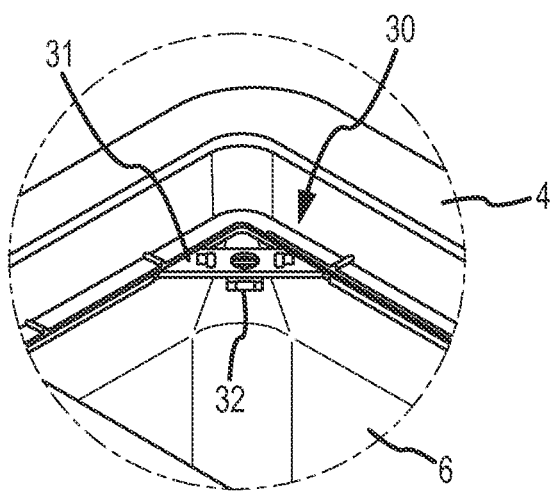
Figure 6:
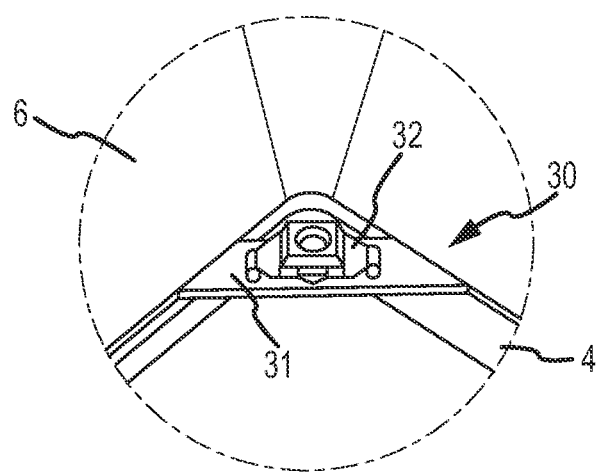
Figure 7:
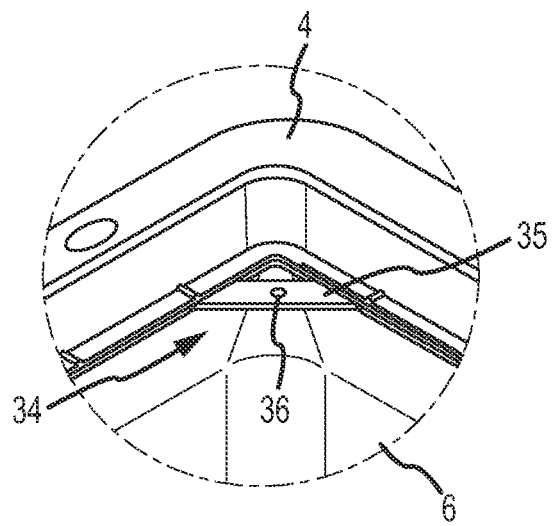
Figure 8:
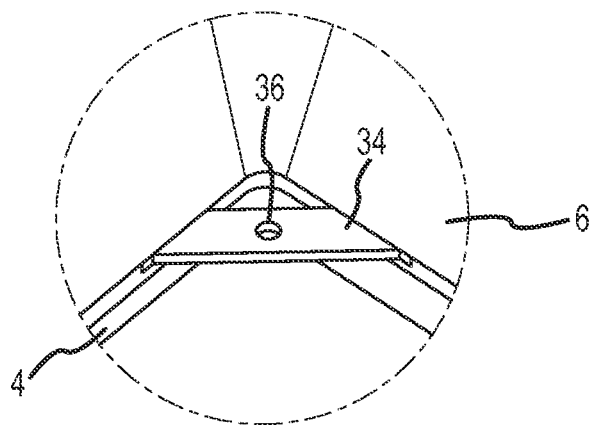
Figure 9:
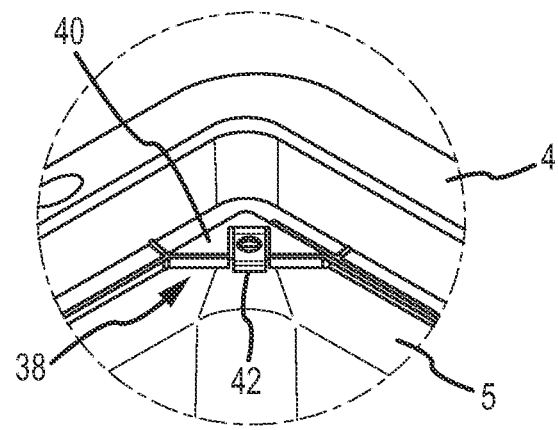
Figure 10:
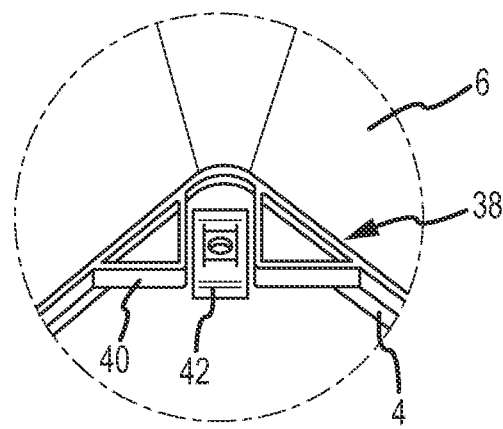
Figure 11:
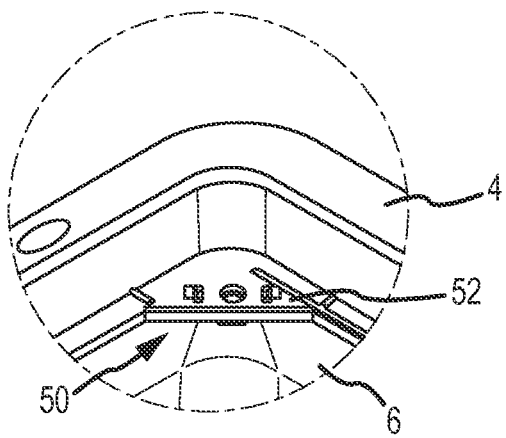
Figure 12:
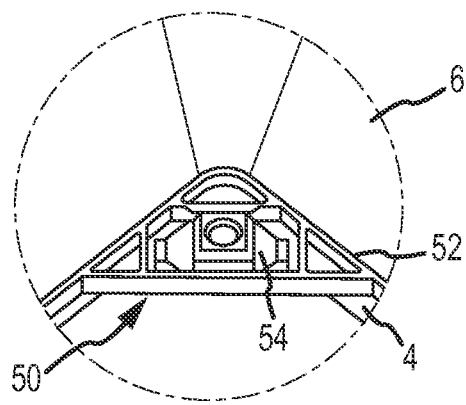
Figure 13:
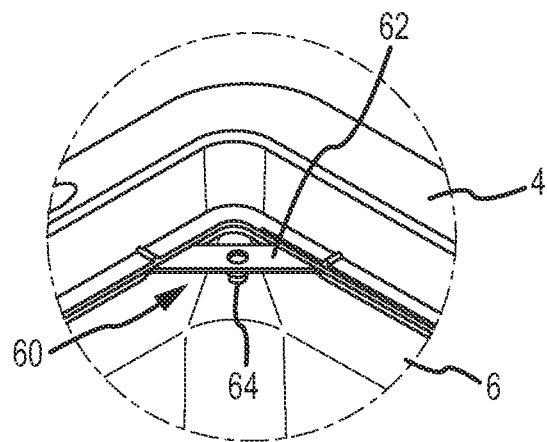
Figure 14:
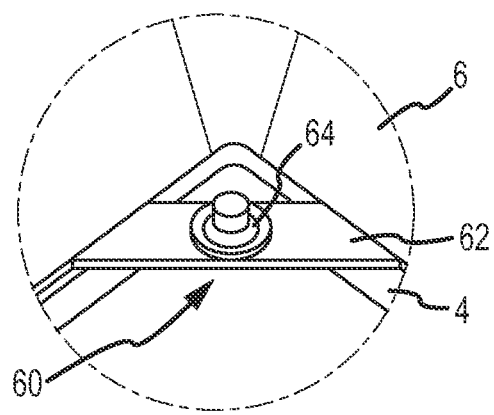
Figure 15:
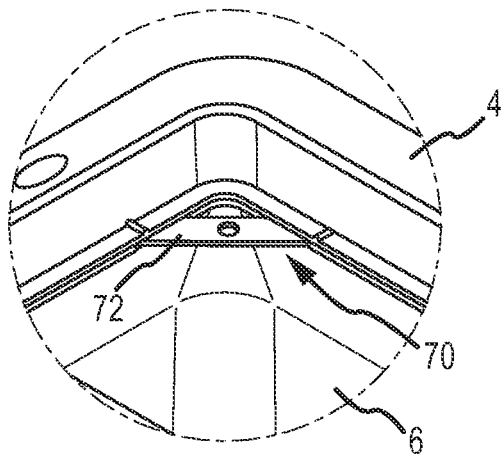
Figure 16:
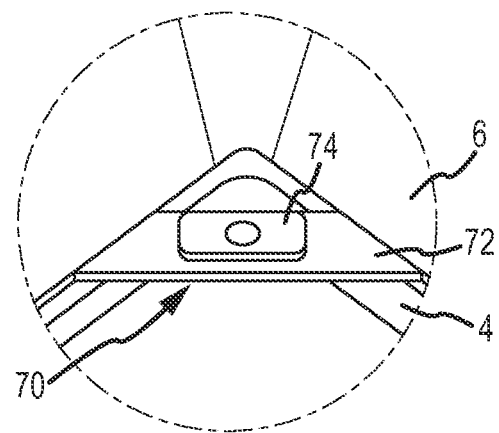
Figure 17:
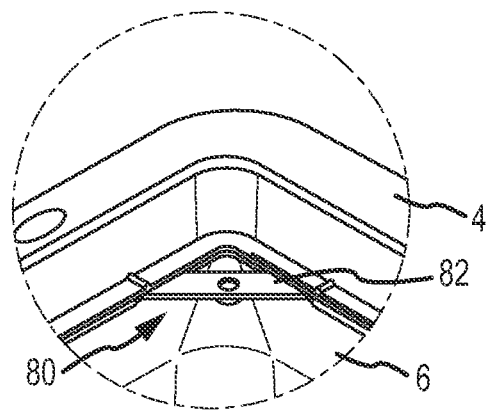
Figure 18:
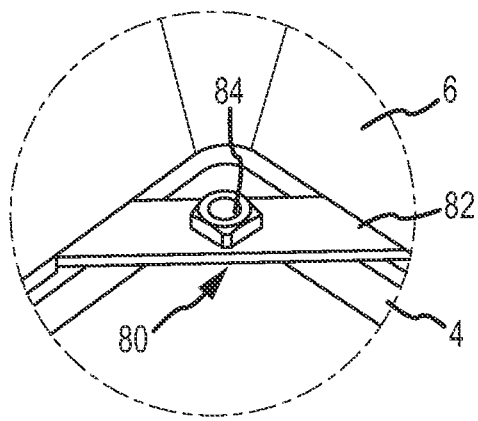
Figure 19:
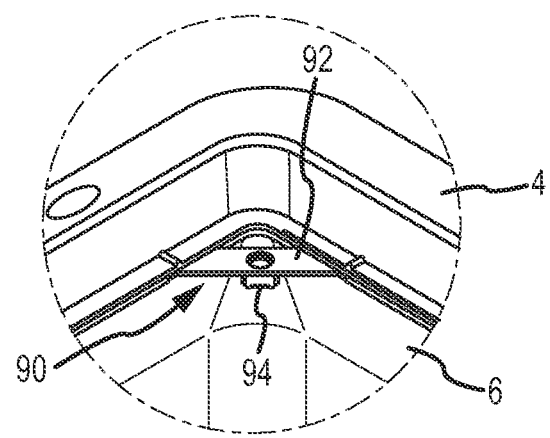
Figure 20:
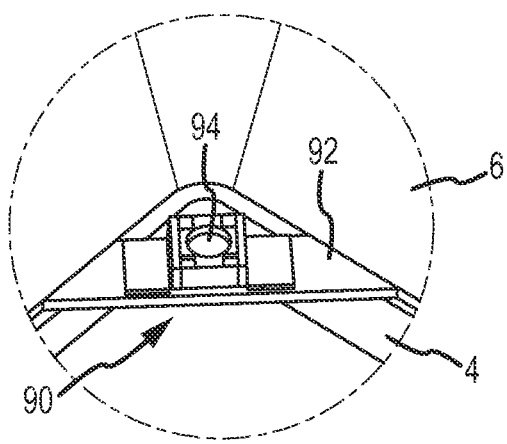
Figure 21:
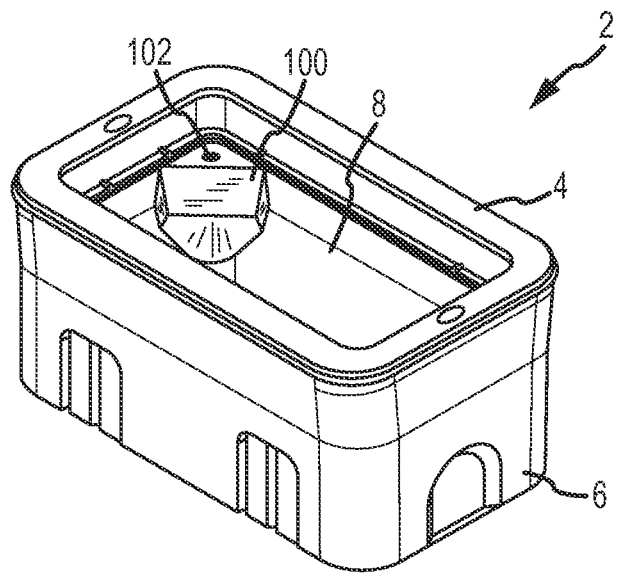
Figure 22:
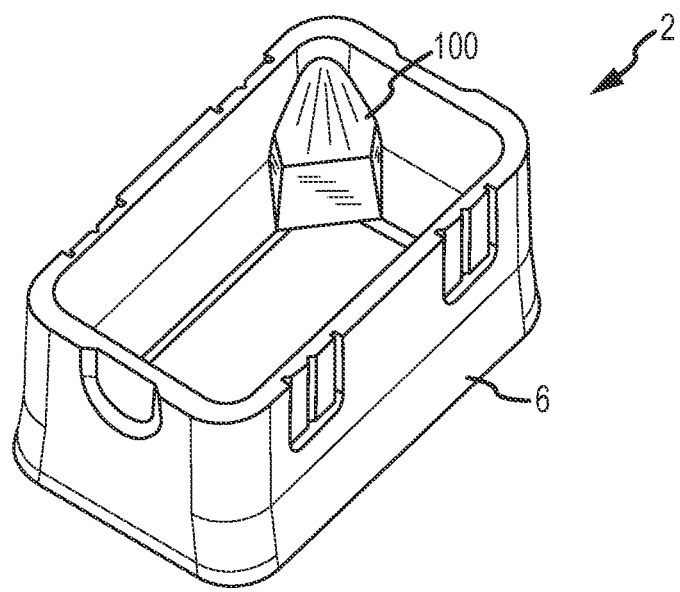
Figure 23:
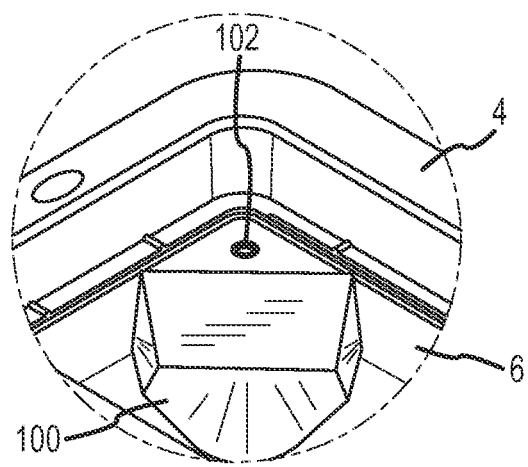

FIG. 1 is a front perspective view of one embodiment of the present invention;

FIG. 1A is a detailed front perspective view of the embodiment of FIG. 1;

FIG. 2 is a front perspective view of one embodiment of the present invention;

FIG. 3 is bottom perspective view of a cap and locking member according to one embodiment;

FIG. 4 is a bottom perspective view of one embodiment of the present invention;

FIG. 5 is a detailed top perspective view of one embodiment of the present invention;

FIG. 6 is a detailed bottom perspective view of one embodiment of the present invention;

FIG. 7 is a detailed top perspective view of one embodiment of the present invention;

FIG. 8 is a detailed bottom perspective view of one embodiment of the present invention;

FIG. 9 is a detailed top perspective view of one embodiment of the present invention;

FIG. 10 is a detailed bottom perspective view of one embodiment of the present invention;

FIG. 11 is a detailed top perspective view of one embodiment of the present invention;

FIG. 12 is a detailed bottom perspective view of one embodiment of the present invention;

FIG. 13 is a detailed top perspective view of one embodiment of the present invention;

FIG. 14 is a detailed bottom perspective view of one embodiment of the present invention;

FIG. 15 is a detailed top perspective view of one embodiment of the present invention;

FIG. 16 is a detailed bottom perspective view of one embodiment of the present invention;

FIG. 17 is a detailed top perspective view of one embodiment of the present invention;

FIG. 18 is a detailed bottom perspective view of one embodiment of the present invention;

FIG. 19 is a detailed top perspective view of one embodiment of the present invention;

FIG. 20 is a detailed bottom perspective view of one embodiment of the present invention;

FIG. 21 is a top perspective view of one embodiment of the present invention;

FIG. 22 is a bottom perspective view of one embodiment of the present invention;

FIG. 23 is a detailed top perspective view of the embodiment of FIGS. 21-22.

DETAILED DESCRIPTION

The present invention provides its benefits across a broad spectrum of endeavors. It is applicant's intent that this specification and the claims appended hereto be accorded a breadth in keeping with the scope and spirit of the invention being disclosed despite what might appear to be limiting language imposed by the requirements of referring to the specific examples disclosed. To acquaint persons skilled in the pertinent arts most closely related to the present invention, a preferred embodiment of the method that illustrates the best mode now contemplated for putting the invention into practice is described herein by, and with reference to, the annexed drawings that form a part of the specification. The exemplary method is described in detail without attempting to describe all of the various forms and modifications in which the invention might be embodied. As such, the embodiments described herein are illustrative, and as will become apparent to those skilled in the arts, can be modified in numerous ways within the scope and spirit of the invention, the invention being measured by the appended claims and not by the details of the specification.

Although the following text sets forth a detailed description of numerous different embodiments, it should be understood that the legal scope of the description is defined by the words of the claims set forth at the end of this disclosure. The detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims.

To the extent that any term recited in the claims at the end of this patent is referred to in this patent in a manner consistent with a single meaning, that is done for sake of clarity only so as to not confuse the reader, and it is not intended that such claim term by limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

While various embodiments of the present disclosure have been described in detail, it is apparent that modifications and alterations of those embodiments will occur to those skilled in the art. However, it is to be expressly understood that such modifications and alterations are within the scope and spirit of the present disclosure, as set forth in the following claims.

FIGS. 1-1A depict a subgrade vault 2 according to one embodiment of the present invention wherein a cap 4 is disposed on or provided in connection with a main body portion 6. The cap generally comprises a plastic material on fiberglass and the main body portion comprises a concrete material. As shown, the vault 2 comprises an open center portion 8 which, in one embodiment, is bounded by four sidewalls of the main body portion 6 and is generally open at a top and bottom. In various embodiments, a main body portion 6 is formed of concrete by placing a plastic cap in a generally up-side down position and pouring a quantity of concrete onto the cap via a mold or guide. The cap 4 is sealed to the concrete with numerous projections which extend into the concrete. Thus, in various embodiments, the wall thickness of a main body portion 6 of the present invention is approximately equal to a cap width as shown and described.

Embodiments of the present invention further comprise at least one locking element 10, which is partially mounted or secured within a cap/main body portion and partially extends into an open center portion 8 of the vault. In one embodiment, a locking element comprises a rigid member 12, such as a metal bar having a length wherein at least a portion of the length extends into an area around which concrete is poured and formed. A method of manufacture is contemplated wherein a locking element 10 is placed on or proximal to a cap upon which a concrete main body portion is to be formed. Upon pouring or forming a concrete main portion, the locking member 10 becomes secured to the finished product due to at least a part of the length of the locking element 10 residing in the path of poured concrete and/or concrete being poured through apertures provided in the locking element 10.

As shown in FIGS. 1 and 1A, at least one threaded clip 14 is provided in association with each locking element 10. In various embodiments, the threaded clip 14 provides for a female threaded portion through which a fastener such as a bolt may be threaded, thereby reducing the cost of the locking member 10 by allowing the locking member to be constructed using fewer materials.

FIG. 2 is a perspective view of the embodiment shown in FIGS. 1 and 1A wherein a lid 16 for a subgrade vault 2 is provided. As shown, the lid 16 may be sized to rest upon a shoulder or shelf portion 5 of the cap 4, such that an upper surface of the lid 16 is generally flush with upper portions of the cap 4 when the lid 16 is in a closed position. The lid 16 is provided with at least one aperture 18, and preferably two apertures 18a, 18b adapted to align with a portion of a locking element 10 when the lid 16 is in a closed position. Thus, a fastener 20a, 20b may be placed through an aperture 18a, 18b of the lid 16 and threaded through and/or connected with a locking element 10 disposed below the lid. Various embodiments of the present invention contemplate the use of tamper-proof or tamper-resistant fasteners, such that when a lid 16 is applied to a cap 4 and a fastener 20 is employed to secure the lid 16, contents housed within the subgrade vault 2 are generally inaccessible to those lacking the proper means (e.g. specialty tools). Although not shown in FIG. 2, selectively removable caps or covers may be provided to protect fasteners from the elements, render them less obvious to potential trespassers, and/or create a more uniform and aesthetically pleasing upper portion of the lid 16.

In various embodiments, lids of the present invention comprise at least one lift interface 22 for providing a point of attachment for various devices design to lift or displace the lid. Lift interfaces 22 may comprise a recess having a rigid member or post adapted for grasping or communication with a lifting device comprising a hook, as will be recognized by one of ordinary skill in the art.

FIG. 3 is a bottom perspective view of a locking element 10 disposed on a cap 4 prior to the pouring or extruding of a concrete main body portion. As shown, the locking element 10 comprises a rigid member 12 with a central aperture 24 and clip nut 14. Central aperture 24 is designed to selectively receive a fastener to secure, for example, a lid. Additional apertures 25a, 25b, 25c, 25d are provided for positioning the central aperture 24 with respect to the cap. Apertures 25a-25d provide for three predetermined positions at which the locking element 10 may be disposed with respect to the cap 4. Posts 26a, 26b or similar features are provided on an underside of the cap to indicate the required position(s) of the element 10 and help secure the element 10 during extrusion or pouring of concrete. Additional apertures 27a, 27b are provided to increase the surface area of the member 10 and provide a secure connection between the cap 4, locking member 10, and main body portion (see 6 in FIG. 1).

FIG. 4 is a bottom perspective view of a subgrade vault 2 with extruded concrete main body portion 6. A locking element 10 is secured therein, the locking element in fixed communication between and with the cap 4 and main body portion 6. The element 10 is further provided with a clip nut 14. It will be recognized, however, that element 10 may be provided with various different features for securing a fastener, as shown and described herein.

FIGS. 5-6 are detailed top and bottom perspective views, respectively, depicting another embodiment of a locking element 30. As shown, a subgrade vault is provided comprising a main body portion 6, a cap 4 and a locking element 30 comprising a rigid member 31 and a cage nut 32. As will be recognized by one of ordinary skill in the art, a cage nut 32 may serve a similar purpose as a clip nut. The locking element 30 comprises a rigid member 31 with a through-hole for receiving a bolt or fastener and apertures for receiving wings or arms of the cage nut 32. Accordingly, a cage nut 32 may be applied to the rigid member and provide means for securely receiving a fastener and securing a lid (not shown in FIGS. 5-6). The combination of the rigid member 31 and cage nut 32 provide a secure locking element 30 integrally formed with a subgrade vault at a vertical location designed to reside below ground-level. Enhanced security is thereby provided due to the concealed nature of the locking element 30 as well as secure attachment between the locking element 30, associated features, cap 4 and/or main body portion 6 of the vault.

FIGS. 7-8 depict yet another embodiment of the present invention comprising a main body portion 6, a cap 4, and a locking element 34. As shown, the locking element 34 comprises rigid member 35 having a threaded through-hole 36 adapted for receiving a fastener. Locking element 34 is secured within the vault by virtue of being integrally formed with the main body portion 6 and/or the cap 4. Accordingly, a lid may be securely connected to the cap 4 and main body portion 6 by securing the lid to the locking element 34 by applying a threaded fastener through threaded through-hole 36. In an alternative embodiment, through-hole 36 comprises a non-threaded feature, through which a bolt or similar fastener may be disposed and secured by application of a nut or other attachment hardware. Thus, in various embodiments, a locking element is provided comprising the ability to receive a fastener and does not require additional devices, such as a cage nut.

FIGS. 9-10 depict yet another embodiment of the present invention comprising a cap 4, main body portion 6 of a subgrade vault, and locking element 38. Locking element 38 comprises a rigid fillet 40 or corner portion of the cap 4 extending into an open center portion of the vault, such that at least a portion of the locking element 38 and cap 4 are formed of a single piece of material. Locking element 38 may be provided with a variety of fasteners or devices. In the embodiment shown in FIGS. 9-10, locking element 38 is provided with at least one through-hole or aperture and a clip nut 42 for receiving a fastener. Clip nut 42 comprises a metal bracket having upper and lower portions and a threaded aperture provided therethrough. To secure a lid to the cap 4 and vault, the clip nut 42 is placed around a portion of the fillet 40 such that apertures in the clip nut 42 align with at least one aperture in the fillet 40 and allow for a fastener to be received. The fastener, as previously described, may be threaded or placed through an aperture in a lid and the lid at least partially secured by a head or flange of the fastener.

FIGS. 11-12 depict yet another embodiment of the present invention comprising a cap 4, main body portion 6 of a subgrade vault, and locking element 50. Locking element 50 comprises a substantially rigid fillet 52 or corner portion of the cap 4 extending into an open center portion of the vault, such that at least a portion of the locking element 50 and cap 4 are formed of a single piece of material. Locking element 50 may be provided with a variety of fasteners or devices. In the embodiment shown in FIGS. 11-12, locking element 50 is provided with at least one through-hole and a cage nut 54 for receiving a fastener. Cage nut 54 comprises a conventional cage nut with spring steel wings such that it may be secured to the rigid member 52. To secure a lid to the cap 4 and vault, the cage nut 54 is applied to rigid fillet 52 and aligned with at least one aperture to allow for a fastener to be received. The fastener, as previously described, may be threaded or placed through an aperture in a lid and the lid at least partially secured at one by a head or flange of the fastener.

As shown in the embodiments provided in FIGS. 9-12, a cap 4 of the present invention comprises a fillet or triangular extension in at least one corner of the cap. Thus, in various embodiments, the rigid member or fillet comprises and integral portion of the cap such that an additional component (e.g. a rigid bar) need not be inserted prior to the pouring of concrete upon the cap to create the main body portion. Alternatively, the metal bar may be inserted into the mold and impregnated into the mold for the plastic cap.

FIGS. 13-14 depict yet another embodiment of the present invention comprising a main body portion 6, a cap 4, and a locking element 60, wherein the locking element 60 comprises a metal bracket 62 secured to the cap 4 and/or main body portion 6 and a round base weld nut 64. The round base weld nut 64, in combination with various other features described herein, provides means for securing a fastener in the particular embodiment shown in FIGS. 13-14.

FIGS. 15-16 depict yet another embodiment of the present invention comprising a main body portion 6, a cap 4, and a locking element 70, wherein the locking element 70 comprises a metal bracket 72 secured to the cap 4 and/or main body portion 6 and a tab base weld nut 74. The tab base weld nut 74, in combination with various other features described herein, provides means for securing a fastener in the particular embodiment shown in FIGS. 15-16.

FIGS. 17-18 depict yet another embodiment of the present invention comprising a main body portion 6, a cap 4, and a locking element 80, wherein the locking element 80 comprises a metal bracket 82 secured to the cap 4 and/or main body portion 6 and a projection weld nut 84. The projection weld nut 84, in combination with various other features described herein, provides means for securing a fastener in the particular embodiment shown in FIGS. 17-18.

FIGS. 19-20 depict yet another embodiment of the present invention comprising a main body portion 6, a cap 4, and a locking element 90, wherein the locking element 90 comprises a metal bracket 92 secured to the cap 4 and/or main body portion 6 and a bridge weld nut 94. The bridge weld nut 94, in combination with various other features described herein, provides means for securing a fastener in the particular embodiment shown in FIGS. 19-20.

FIGS. 21-23 depict yet another embodiment of the present invention comprising a cap 4, a main body portion 6, and a corner feature 100 disposed generally in a corner of the main body portion 6. The corner feature 100 comprises an extruded or extended portion of the main body portion 6 and at least one female threaded aperture 102 for receiving at least one fastener. FIG. 21 is a top perspective view, FIG. 22 is a bottom perspective view, and FIG. 23 is a detailed top perspective view.

In various embodiments, a corner feature 100 of the present invention comprises a threaded female member 102 within which a fastener may be placed. In certain embodiments, particularly those where the corner feature 100 is comprised of a concrete material, the corner feature 100 comprises an aperture 102 within which a threaded insert or sleeve may be provided. In one particular embodiment, the corner feature 100 comprises a mass of concrete that provides structural support or a region within which a threaded sleeve may be inserted, the threaded sleeve adapted to receive a fastener for securing a lid. Thus, in various embodiments, a main body portion may be formed with a protrusion or extension of concrete capable of withstanding various loads, such as loads provided by the application of force to the threaded sleeve via a fastener and connected lid.

While FIGS. 12-23 generally depict a subgrade vault 2 comprising a corner feature 100 for securing one or more fasteners, it will be expressly recognized that the present invention is not limited to an extrusion or extension disposed in a corner of the vault 2. Indeed, it is contemplated that such features or extensions may be provided at a variety of locations including, for example, along the interior lengths of the main body portion 6 sidewalls.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments for the purpose of streamlining the disclosure. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment. Thus, the following claims are hereby incorporated into this Detailed Description, with each claim standing on its own as a separate preferred embodiment of the disclosure.

Moreover, though the present disclosure has included description of one or more embodiments and certain variations and modifications, other variations and modifications are within the scope of the disclosure, e.g. the use of a certain component described above alone or in conjunction with other components may comprise a system, while in other aspects the system may be the combination of all of the components described herein, and in different order than that employed for the purpose of communicating the novel aspects of the present disclosure. Other variations and modifications may be within the skill and knowledge of those in the art, after understanding the present disclosure. This method of disclosure is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A subgrade vault for providing an enclosed region to house utility connections, the vault comprising:
 a body portion having four side walls which define an enclosure, each of the four side walls having a predetermined thickness, an upper end, and a lower end;

a substantially rectangular shaped cap member having first and second length members provided substantially parallel to one another and third and fourth width members provided substantially parallel to one another and oriented substantially perpendicular to said first and second length members, said length members being longer than said width members;

a substantially rigid fillet interconnecting at least one of said length members and at least one of said width members;

a locking assembly comprising a central aperture and at least one extension, the extension in operable engagement with the substantially rigid fillet and providing force-transmitting communication between said locking assembly and said fillet;

said substantially rigid fillet comprising a first aperture for alignment with said central aperture of said locking assembly, and a second aperture for receiving said at least one extension;

a lid for selectively securing the subgrade vault to prevent entry, the lid comprising an aperture for receiving an elongated fastener adapted to secure the lid to the subgrade vault.

2. The subgrade vault of claim 1, wherein the locking assembly comprises a threaded aperture.

3. The subgrade vault of claim 1, wherein the substantially rectangular shaped cap comprises a moldable plastic material which is interconnected to an upper portion of said body portion.

4. The subgrade vault of claim 1, wherein the body portion comprises concrete.

5. The subgrade vault of claim 1, further comprising an elongated fastener, and wherein at least a portion of the elongated fastener extends through the locking assembly.

6. A vault for providing an enclosed region to house utility connections, said vault comprising:

a concrete main body portion having a peripheral wall with an upper end and a lower end to define the enclosed region;

a cap portion integrally interconnected to said upper end of said concrete main body portion, said cap portion comprising an inwardly extending shoulder;

a lid for selectively securing said enclosed region, said lid comprising an upper surface and a lower surface, and a predetermined length, a width, and a height;

said lid at least partially engaging said cap portion, wherein said lower surface is in contact with said shoulder and said upper surface is substantially flush with an upper surface of said cap portion;

a substantially rigid member positioned in a corner of said cap portion and comprising a central aperture, and wherein said substantially rigid member comprises an inwardly projecting extension of said cap member, said inwardly projecting extension comprising at least one aperture;

a locking assembly comprising a central aperture, the locking assembly in operable engagement with the substantially rigid member;

an elongated fastener with a head and a shank, said shank being passed through an opening in said lid and extending at least partially through said locking assembly.

7. The subgrade vault of claim 6, wherein said substantially rigid member further comprises at least one of a clip nut, a cage nut, a threaded hole, a weld nut, a base weld nut, a projection weld nut, and a bridge weld nut.

8. The subgrade vault of claim 6, wherein said substantially rigid member comprises an inwardly projecting extension of said cap portion, said and comprising at least one female threaded portion for receiving a-said elongated fastener.

9. A subgrade vault for providing an enclosed region to house utility connections, the vault comprising:

a precast concrete body portion having four side walls which define an enclosure, each of the four side walls having a predetermined thickness, an upper end, and lower end;

a substantially rectangular cap member having a perimeter and predetermined space defined within said perimeter and integrally interconnected to an upper surface of said body portion;

a locking member positioned proximate to a corner of said substantially rectangular cap member, said locking member extending into said predetermined space and comprising an upper surface, a lower surface, and a first aperture extending between said upper surface and said lower surface;

a fastener provided on said locking member, said fastener comprising a central aperture and at least one extension, the extension extending into the locking member and providing force-transmitting communication between said fastener and said locking member;

said locking member comprising a second aperture for receiving said extension;

a lid for selectively securing the enclosed region, the lid comprising an aperture for receiving an elongate fastener, and said elongate fastener adapted to secure the lid to the locking member.

10. The subgrade vault of claim 9, wherein said second aperture has a geometric shape of at least one of a rectangle and a square.

11. The subgrade vault of claim 9, wherein the locking member comprises a through hole, a second aperture, and a third aperture.

12. The subgrade vault of claim 9, wherein the locking member and the cap member comprise a single piece of molded plastic.

13. The subgrade vault of claim 9, wherein the locking assembly is comprised of a plastic material and the fastener is comprised of a metal material.

14. The subgrade vault of claim 1, wherein the locking element and the cap member comprise a single piece of molded plastic.

15. The subgrade vault of claim 1, wherein the locking element is comprised of a plastic material and the fastener is comprised of a metal material.

16. The subgrade vault of claim 1, wherein the locking element further comprises a third aperture for receiving a second extension provided on said fastener.

17. The subgrade vault of claim 1, wherein the locking element comprises a first aperture for receiving a fastener and two secondary apertures to receive said at least one extension.

18. The subgrade precast concrete vault of claim 6, wherein said substantially rigid member comprises a second aperture for receiving a portion of a locking assembly.

* * * * *